(12) United States Patent
Zhao et al.

(10) Patent No.: US 12,403,552 B2
(45) Date of Patent: Sep. 2, 2025

(54) ROLLER TOOTH PROFILE OF WORK ROLL FOR ROLL FORMING OF FLOW CHANNEL OF METAL BIPOLAR PLATE AND PARAMETRIC DESIGN METHOD THEREOF

(71) Applicant: Taiyuan University of Science and Technology, Taiyuan (CN)

(72) Inventors: Fuqiang Zhao, Taiyuan (CN); Xiaolong Xie, Taiyuan (CN); Qingxue Huang, Taiyuan (CN); Hugang Tian, Taiyuan (CN); Yanlei Zhang, Taiyuan (CN); Hongwei Wang, Taiyuan (CN)

(73) Assignee: Taiyuan University of Science and Technology, Taiyuan (CN)

( * ) Notice: Subject to any disclaimer, the term of this patent is extended or adjusted under 35 U.S.C. 154(b) by 158 days.

(21) Appl. No.: 18/337,114

(22) Filed: Jun. 19, 2023

(65) Prior Publication Data

US 2023/0330791 A1   Oct. 19, 2023

(30) Foreign Application Priority Data

Jun. 20, 2022   (CN) .......................... 202210697348.5

(51) Int. Cl.
   *B23P 15/28*   (2006.01)
(52) U.S. Cl.
   CPC ................... *B23P 15/28* (2013.01)
(58) Field of Classification Search
   CPC .................. B23P 15/28; B21D 5/08
   See application file for complete search history.

(56) References Cited

U.S. PATENT DOCUMENTS

| | | | | |
|---|---|---|---|---|
| 2003/0200781 A1* | 10/2003 | Hodjat | ................. | B21D 53/261 |
| | | | | 72/83 |
| 2004/0237722 A1* | 12/2004 | Ponemayr | .............. | B23D 65/00 |
| | | | | 76/112 |
| 2017/0028454 A1* | 2/2017 | Ziesel | .................... | B21H 7/187 |
| 2019/0281768 A1* | 9/2019 | Derscheid | ............. | A01D 90/04 |
| 2020/0156203 A1* | 5/2020 | Klug | .................... | B24B 41/066 |
| 2021/0292050 A1* | 9/2021 | Tassias | ................... | B65D 35/40 |
| 2022/0203491 A1* | 6/2022 | Fuse | ....................... | B26D 5/00 |

FOREIGN PATENT DOCUMENTS

| CN | 108941204 A | 12/2018 |
|---|---|---|
| CN | 113319128 A | 8/2021 |

* cited by examiner

*Primary Examiner* — Omar Flores Sanchez

(57) ABSTRACT

This application discloses a parametric design method of a roller tooth profile of a work roll for roll forming of a flow channel of a metal bipolar plate. The method includes: (1) an engagement transmission drawing is plotted according to depth h of the flow channel and a rolling period angle, where $h=r_1-r_6$. A first-half surface of a tooth consists of six segments, where the top surface segment, the upper half segment of the tooth side, the root segment, and the transition segments for the top corner and the root corner are arc curves, and the lower half segment of the tooth side is a straight line. (2) With the center $O_1$ of the upper roller as the origin, a transverse end coordinate system is established, and the six segments of the left-half tooth are designed regarding parameters.

4 Claims, 3 Drawing Sheets

ROLLER TOOTH PROFILE OF WORK ROLL FOR ROLL FORMING OF FLOW CHANNEL OF METAL BIPOLAR PLATE AND PARAMETRIC DESIGN METHOD THEREOF

CROSS-REFERENCE TO RELATED APPLICATIONS

This application claims the benefit of priority from Chinese Patent Application No. 202210697348.5, filed on Jun. 20, 2022. The content of the aforementioned application, including any intervening amendments thereto, is incorporated herein by reference in its entirety.

TECHNICAL FIELD

This application relates to roller tooth profile design of work rolls for roll forming of a metal bipolar plate in a hydrogen fuel cell, and more particularly to a roller tooth profile of a work roll for roll forming of a flow channel of a metal bipolar plate and parametric design method thereof.

BACKGROUND

The metal bipolar plate is a core component of hydrogen fuel cell stacks, whose flow channel can be continuously processed through roll processing. At present, the roller commonly used for the flow channel processing has an involute-tooth profile, which is difficult to process the flow channel whose inclination of a sidewall is right angle. Besides, products produced by such rollers are small in product cycle and poor in heat dissipation, and cannot meet the requirements of product quality.

SUMMARY

A object of the present disclosure is to provide a roller tooth profile of a work roll for roll forming of a flow channel of a metal bipolar plate to overcome the deficiencies in the prior art.

The technical solution of the present disclosure is described below.

In a first aspect, this application provides a roller tooth profile of a work roll for roll forming of a flow channel of a metal bipolar plate, wherein the work roll comprises an upper roller and a lower roller, and each of the upper roller and the lower roller comprises a plurality of teeth and a plurality of grooves; and the roller tooth profile is determined based on flow channel depth h and a rolling period, wherein $h = r_1 - r_6$; the rolling period is determined by a period angle $\varphi$ which is an angle between center lines of two adjacent teeth; $r_1$ is a radius of a tooth top circle of the upper roller; and $r_6$ is a radius of a tooth root circle of the upper roller;

a roller tooth profile diagram is plotted according to the flow channel depth h and the rolling period; a first-half surface of a tooth of the upper roller consists of a tooth top surface segment AB, a tooth top angle segment BC, a tooth-side upper half segment CD, a tooth-side lower half segment DE, a tooth root angle segment EF, and a tooth root segment FG; wherein the segment AB is taken from a first circle with a center $O_1$ of the upper roller as center and the radius $r_1$ as radius; the segment CD is taken from a second circle with a center $O_3$ of an adjacent tooth as center and $r_3$ as radius, wherein $r_3$ is a distance from the center $O_3$ to a tooth-side point of the tooth corresponding to the segment AB; the segment BC is an arc transition segment tangent to points B and C and with $O_2$ as center; the segment DE is a straight segment tangent to point D; the segment FG is an arc segment with $O_1$ as center and the radius $r_6$ as radius; and the segment EF is an arc segment tangent to points E and F and with $O_5$ as center; and the first-half surface of the tooth is the same as second-half surface of the tooth in shape, and symmetrical with the second-half teeth of the tooth; and the upper roller is the same as the lower roller in roller tooth profile.

In a second aspect, this application provides a work roll for roll forming of a flow channel of a metal bipolar plate, wherein the work roll has the aforementioned roller tooth profile.

In a third aspect, this application provides a parametric design method of the aforementioned roller tooth profile, comprising:

establishing a transverse end surface coordinate system with the center $O_1$ of the upper roller as origin, an abscissa axis as X-axis and an ordinate axis as Y-axis, wherein a coordinate formula for the segment AB is represented by:

$$\begin{cases} x_1 = r_1 \cos\theta_1 \\ y_1 = r_1 \sin\theta_1 \end{cases}; \qquad (1)$$

wherein $r_1$ represents the radius of the tooth top circle of the upper roller; and $\theta_1$ represents a parametric variable of a function of the segment AB, with a range of $$\left[\frac{\pi}{2}, \frac{\pi}{2} + \alpha\right];$$

the segment BC is an arc transition section between the segment AB and the segment CD, and a coordinate formula of the segment BC is represented by:

$$\begin{cases} x_2 = r_2 \cos\theta_2 + E_2 \\ y_2 = r_2 \sin\theta_2 + F_2 \end{cases}; \qquad (2)$$

wherein $r_2$ is a radius of a transition arc of a tooth top angle; and $E_2$ and $F_2$ are coordinates of the center $O_2$, and are respectively represented by:

$$E_2 = \frac{(r_3+r_2)^2}{2r\sin\varphi} + \cot\varphi \frac{\dfrac{-(r_3+r_2)^2 \sin\varphi}{r} + \sqrt{\dfrac{(r_3+r_2)^2 \sin^2\varphi}{r^2} - 4\left[\dfrac{(r_3+r_2)^4}{4r^2} - (r_1-r_2)^2\right]}}{2}; \qquad (3)$$

and $$F_2 = \frac{\dfrac{-(r_3+r_2)^2 \sin\varphi}{r} + \sqrt{\dfrac{(r_3+r_2)^2 \sin^2\varphi}{r^2} - 4\left[\dfrac{(r_3+r_2)^4}{4r^2} - (r_1-r_2)^2\right]}}{2}; \qquad (4)$$

wherein $\theta_2$ represents a parametric variable of a function of the segment BC, with a range of $$\left[\arctan\frac{r_1\cos\alpha - F_2}{-r_1\sin\alpha - E_2}, \pi + \arctan\frac{F_2 + r\sin\varphi}{E_2 - r\cos\varphi}\right];$$

a coordinate formula for the segment CD is represented by:

$$\begin{cases} x_3 = r_3\cos\theta_3 - r\sin\varphi \\ y_3 = r_3\sin\theta_3 + r\cos\varphi \end{cases}; \quad (5)$$

wherein $r_3$ is the distance from the center $O_3$ to the tooth-side point of the tooth corresponding to the segment AB; r is a radius of a pitch circle between the segment AB and the segment FG, and $r=(r_1+r_6)/2$, in mm; $\varphi$ is an angle between the Y-axis and a segment $O_1O_3$;

$\varphi$ is obtained according to a flow channel period T through the following formula:

$$\varphi = \frac{T}{r} \cdot \frac{180°}{\pi}; \quad (6)$$

and $\theta_3$ represents a parametric variable of a function of the segment CD, with a range of $$\left[\delta - \frac{\pi}{2}, \arctan\frac{F_2 + r\sin\varphi}{E_2 - r\cos\varphi}\right];$$

a coordinate formula for the segment DE is represented by:

$$\begin{cases} x_4 = a + t \\ y_4 = b + kt \end{cases}; \quad (7)$$

wherein k is a slope of a line where the segment DE is located, and is represented by:

$$k = \frac{\frac{r_3^2 - 2r^2}{2r\sin\varphi} + b\cot\varphi + r\sin\varphi}{r\cos\varphi - b};$$

wherein a and b represent coordinates of point D, and are respectively represented by:

$$a = \frac{r_3^2 - 2r^2}{2r\sin\varphi} + \cot\varphi\cos\varphi\frac{2r^2 - r_3^2}{2r} + \quad (9)$$

$$\cot\varphi\sqrt{\cos^2\varphi\frac{(r_3^2 - 2r^2)^2}{(2r)^2} - \left[\frac{(r_3^2 - 2r^2)^2}{(2r)^2} - \frac{(2r)^2\sin^2\varphi}{4}\right]}; \text{ and}$$

$$b = \cos\varphi\frac{2r^2 - r_3^2}{2r} + \sqrt{\cos^2\varphi\frac{(r_3^2 - 2r^2)^2}{(2r)^2} - \left[\frac{(r_3^2 - 2r^2)^2}{(2r)^2} - \frac{(2r)^2\sin^2\varphi}{4}\right]}; \quad (10)$$

wherein t represents a parametric variable of a function of the segment DE, with a range of $$\left[0, \frac{r_3(\sin\delta - \cos\delta)}{k+1}\right];$$

a coordinate formula for the segment EF is represented by:

$$\begin{cases} x_5 = r_5\cos\theta_5 + E_5 \\ y_5 = r_5\sin\theta_5 + F_5 \end{cases}; \quad (11)$$

wherein $r_5$ is a radius of the segment EF;
an inclination angle of the line where the segment DE is located is expressed by:

$$\delta = \arctan k \quad (12);$$

$E_5$ and $F_5$ represent coordinates of the center $O_5$, and are respectively represented by:

$$E_5 = \frac{2k[r_5\cos\delta - kr_5\sin\delta - ak + b] + \sqrt{4k^2[r_5\cos\delta - kr_5\sin\delta - ak + b]^2 - 4(k^2+1)\left[(r_5\cos\delta - kr_5\sin\delta - ak + b)^2 - (r_6 + r_5)^2\right]}}{2(k^2+1)}; \text{ and} \quad (13)$$

$$F_5 = k(E_5 - r_5\sin\delta) + r_5\cos\delta - ak + b; \quad (14)$$

$\theta_5$ represents a parametric variable of a function of the segment EF, with a range of $$\left[\arctan\frac{-E_5}{F_5} - \frac{\pi}{2}, \arctan\frac{(k+1)(b - F_5) + r_3(\sin\delta - \cos\delta)}{(k+1)(a - E_5) + r_3(\sin\delta - \cos\delta)}\right];$$

a coordinate formula for the segment FG is represented by:

$$\begin{cases} x_6 = r_6\cos\theta_6 \\ y_6 = r_6\sin\theta_6 \end{cases}; \quad (15)$$

wherein $r_6$ is a radius of the segment FG; and $\theta_6$ represents a parametric variable of a function of the segment FG, with a range of $$\left[\frac{\pi}{2} + \arctan\frac{-E_5}{F_5}, \frac{\pi + \varphi}{2}\right];$$

wherein a roller tooth profile curve period T is 1.6-6 mm, wherein the roller tooth profile curve period is equal to the flow channel period T; $r_1$ is 20-200 mm; the flow channel depth h is 0.4-3 mm; $r_2$ is 0.15-0.35 mm; $r_3$ is 2.3-4.5 mm; $r_3$ is 0.15-0.35 mm; and an angle $\alpha$ between $O_1A$ and $O_1B$ is 0.11-4.3°.

The beneficial effects of the present disclosure are described below.

In this application, a working roller with a new roll shape curve is formed by dividing the left-half shape of an upper roller into six consecutive curves. By using the roll system with the roll shape features, a metal bipolar plate whose flow channel has a sidewall inclination angle approximating a right angle can be processed. Such a metal bipolar plate has high heat dissipation capacity, good rigidity, and good sealing assembly performance, which is the ideal shape for hydrogen fuel cells. Therefore, so it is necessary to machine the metal bipolar plate whose flow channel has the sidewall inclination angle approximating a right angle.

DETAILED DESCRIPTION OF EMBODIMENTS

According to known conditions, namely, a depth h of the flow channel and a rolling period, a roller tooth profile of a work roll for roll forming of a flow channel of a metal bipolar plate is determined, as shown in FIGS. 1-4, where $h=r_1-r_6$; the rolling period is determined by a period angle $\varphi$ which is an angle between center lines of two adjacent teeth; $r_1$ is a radius of a tooth top circle of the upper roller; and $r_6$ is a radius of a tooth root circle of the upper roller.

Figure 1:
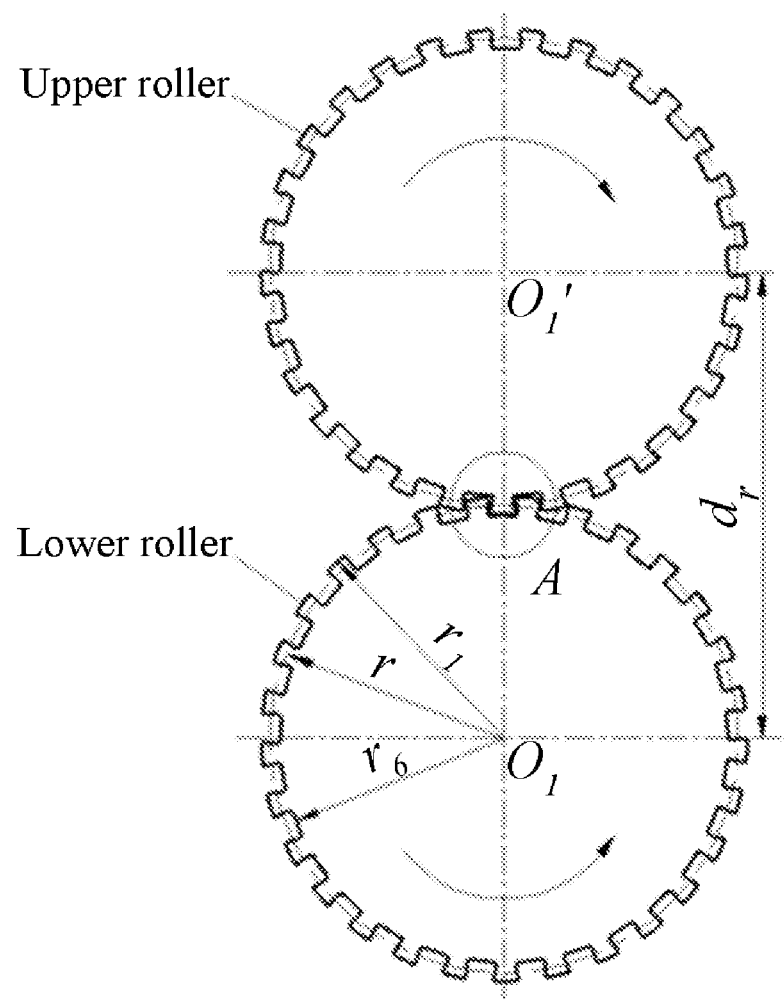
FIG. 1 schematically shows an engagement of an upper roller and a lower roller according to an embodiment of the present disclosure.
Figure 2:
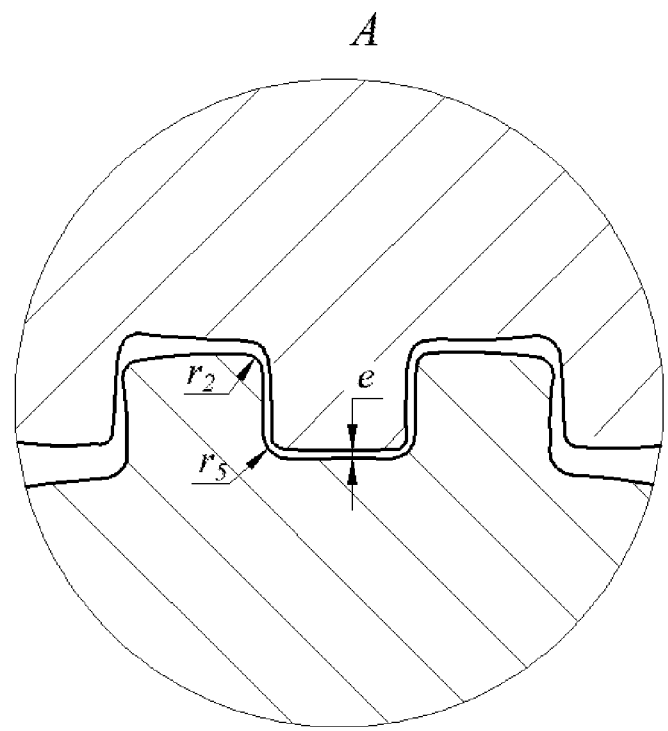
FIG. 2 is an enlarged view of part A in FIG. 1.
Figure 3:
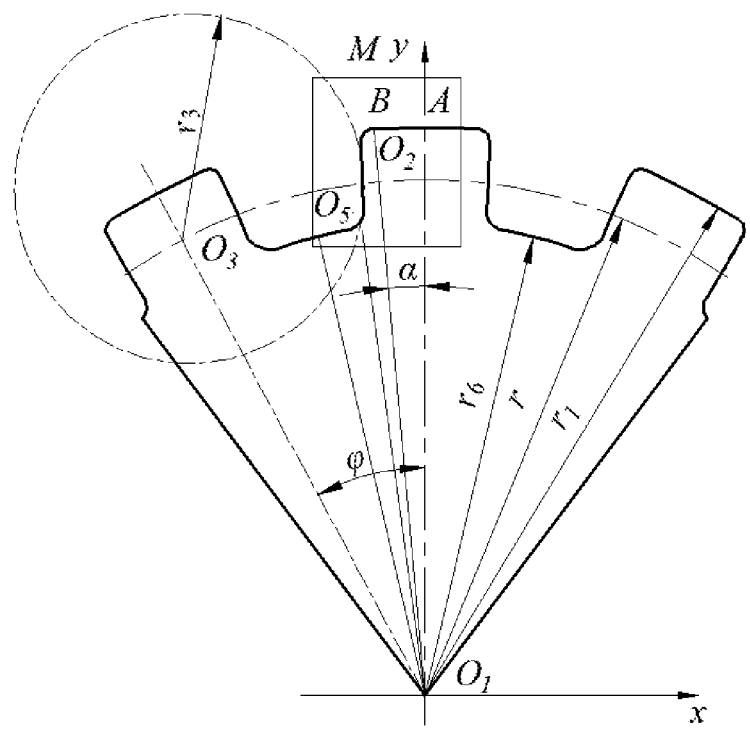
FIG. 3 is a partial enlargement of the upper roller according to an embodiment of the present disclosure.
Figure 4:
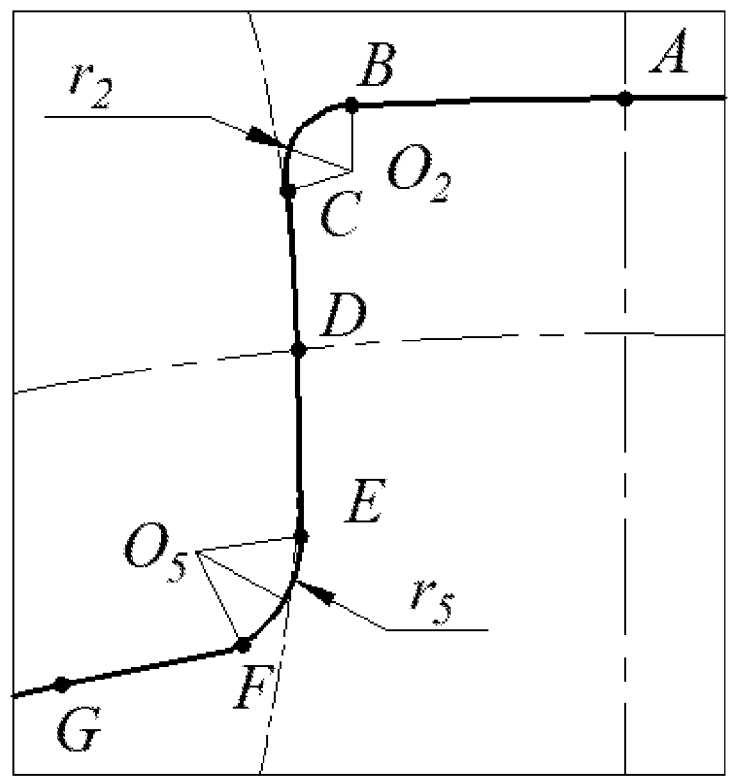
FIG. 4 is an enlarged view of part M in FIG. 3.

As shown in FIG. 4, for a first-half surface of a tooth of the upper roller consists of a tooth top surface segment AB, a tooth top angle segment BC, a tooth-side upper half segment CD, a tooth-side lower half segment DE, a tooth root angle segment EF, and a tooth root segment FG. The segment AB is taken from a first circle with a center $O_1$ of the upper roller as center and the radius $r_1$ as radius. The segment CD is taken from a second circle with a center $O_3$ of an adjacent tooth as center and $r_3$ as radius, where $r_3$ is a distance from the center $O_3$ to a tooth-side point of the tooth corresponding to the segment AB. The segment BC is an arc transition segment tangent to points B and C and with $O_2$ as center. The segment DE is a straight segment tangent to point D. The segment FG is an arc segment with $O_1$ as center and the radius $r_6$ as radius. The segment EF is an arc segment tangent to points E and F and with $O_5$ as center. With segment $O_1A$ as the symmetry axis, symmetry segments that are respectively axisymmetric with the segment AB, the segment BC, the segment CD, the segment DE, the segment EF and the segment FG. The symmetry segments, the segment AB, the segment BC, the segment CD, the segment DE, the segment EF and the segment FG are connected repeatedly with T as a cycle to form a complete circumferential roll cross-section curve. The design of the upper roller is the same as that of a lower roller.

With the center $O_1$ of the upper roller as the origin, a transverse end coordinate system is established with an abscissa axis as X-axis and an ordinate axis as Y-axis, and the parameters of the roller tooth profile are designed.

When designing the roller tooth profile, the depth h is selected as 2 mm, and $r_1$ is selected as 26 mm. According to the formulas $h=r_1-r_6$ and $r=(r_1+r_6)/2$, $r_6$ and r are calculated to be 24 mm and 25 mm, respectively. $\alpha$ is selected as 2.3°, and $\theta_1$ has the range of [90°, 92.3°]. The tooth top surface segment AB the is obtained from formula (1). $r_3$ is selected as 4.2 mm, T is selected as 5.2 mm, and $\varphi$ is determined as 12° according to formular (6). The inclination angle $\delta$ of the tooth-side lower-half segment DE is determined as 97.2° by formular (12). $\theta_3$ has the range of [7.2°, 17.7°], and the tooth-side upper half segment CD is determined by formular (2). $r_2$ is selected as 0.2 mm, and the coordinates of the circle center $O_2$ ($E_2$, $F_2$) are calculated as (−1, 25.8) by formulars (3) and (4), and $O_2$ has the range of [92.3°, 197.7°]. The tooth top angle BC segment is determined by formula (2). The coordinates of the point D (a, b) are calculated as (−1.06, 24.97) by formulas (9) and (10). The slope k of the tooth-side lower half segment DE is determined as −7.9 by formula (8), and the range of t is (0,0.8). The tooth-side lower half segment DE is determined by formula (7). $r_5$ is selected as 0.2 mm. The coordinates of circle center $O_5$ ($E_5$, $F_5$) are determined as (−1.2, 24.2) by formulas (13) and (14). The range of 05 is [−87.3°, 7.2°], and the tooth root angle segment EF is determined by formula (11). The range of $\theta_6$ is [92.7°, 96°], and the tooth root segment FG is determined by formula (15).

Figure 5:
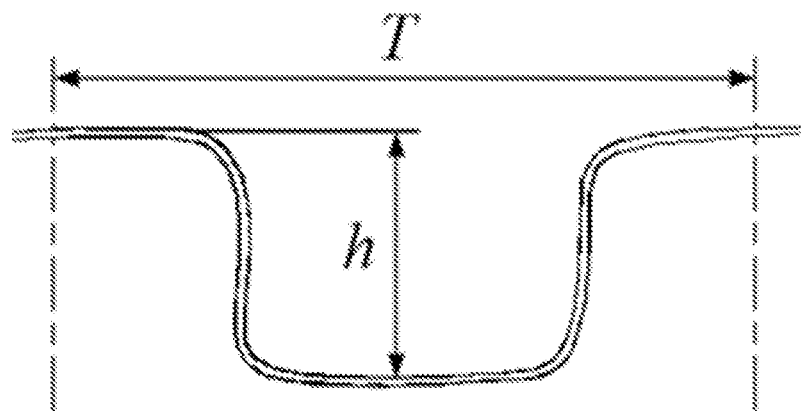
FIG. 5 schematically shows a product whose sidewall inclination angle approximates a right angle produced through roll forming.

With segment $O_1A$ as the symmetry axis, symmetry segments that are respectively axisymmetric with the segment AB, the segment BC, the segment CD, the segment DE, the segment EF and the segment FG. The symmetry segments, the segment AB, the segment BC, the segment CD, the segment DE, the segment EF and the segment FG are connected repeatedly with T as a cycle to form a complete circumferential roll cross-section curve. The upper roller is the same as the lower roller in roller tooth profile. The roll gap e is selected to be 0.2 mm, and the center distance dr is selected to be 50.2 mm to assemble the upper roller and the lower roller. As shown in FIG. 5, a metal bipolar plate whose flow channel has a period T of 5.55 mm, a depth h of 1.95 mm and a sidewall inclination of approximately right angle is obtained.

What is claimed is:

1. A roller tooth profile of a work roll for roll forming of a flow channel of a metal bipolar plate, wherein the work roll comprises an upper roller and a lower roller, and each of the upper roller and the lower roller comprises a plurality of teeth and a plurality of grooves; and the roller tooth profile is determined based on flow channel depth h and a rolling period, wherein $h=r_1-r_6$; the rolling period is determined by a period angle $\varphi$ which is an angle between center lines of two adjacent teeth; $r_1$ is a radius of a tooth top circle of the upper roller; and $r_6$ is a radius of a tooth root circle of the upper roller;

a roller tooth profile diagram is plotted according to the flow channel depth h and the rolling period; a first-half surface of a tooth of the upper roller consists of a tooth top surface segment AB, a tooth top angle segment BC, a tooth-side upper half segment CD, a tooth-side lower half segment DE, a tooth root angle segment EF, and a tooth root segment FG; wherein the segment AB is taken from a first circle with a center $O_1$ of the upper roller as center and the radius $r_1$ as radius; the segment CD is taken from a second circle with a center $O_3$ of an adjacent tooth as center and $r_3$ as radius, wherein $r_3$ is a distance from the center $O_3$ to a tooth-side point of the tooth corresponding to the segment AB; the segment BC is an arc transition segment tangent to points B and C and with $O_2$ as center; the segment DE is a straight segment tangent to point D; the segment FG is an arc segment with $O_1$ as center and the radius $r_6$ as radius; and the segment EF is an arc segment tangent to points E and F and with $O_5$ as center; and the first-half surface of the tooth is the same as second-half surface of the tooth in shape, and symmetrical with the second-half teeth of the tooth; and the upper roller is the same as the lower roller in roller tooth profile.

2. A work roll for roll forming of a flow channel of a metal bipolar plate, wherein the work roll has the roller tooth profile of claim 1.

3. A parametric design method of the roller tooth profile of claim 1, comprising:

establishing a transverse end surface coordinate system with the center $O_1$ of the upper roller as origin, an abscissa axis as X-axis and an ordinate axis as Y-axis, wherein a coordinate formula for the segment AB is represented by:

$$\begin{cases} x_1 = r_1\cos\theta_1 \\ y_1 = r_1\sin\theta_1 \end{cases}; \quad (1)$$

wherein $r_1$ represents the radius of the tooth top circle of the upper roller; and $\theta_1$ represents a parametric variable of a function of the segment AB, with a range of $$\left[\frac{\pi}{2}, \frac{\pi}{2}+\alpha\right];$$

the segment BC is an arc transition section between the segment AB and the segment CD, and a coordinate formula of the segment BC is represented by:

$$\begin{cases} x_2 = r_2\cos\theta_2 + E_2 \\ y_2 = r_2\sin\theta_2 + F_2 \end{cases}; \quad (2)$$

wherein $r_2$ is a radius of a transition arc of a tooth top angle; and $E_2$ and $F_2$ are coordinates of the center $O_2$, and are respectively represented by:

$$E_2 = \frac{(r_3+r_2)^2}{2r\sin\varphi} + \cot\varphi \frac{\frac{-(r_3+r_2)^2\sin\varphi}{r} + \sqrt{\frac{(r_3+r_2)^2\sin^2\varphi}{r^2} - 4\left[\frac{(r_3+r_2)^2}{4r^2} - (r_1-r_2)^2\right]}}{2}; \quad (3)$$

and $$E_2 = \frac{\frac{-(r_3+r_2)^2\sin\varphi}{r} + \sqrt{\frac{(r_3+r_2)^2\sin^2\varphi}{r^2} - 4\left[\frac{(r_3+r_2)^4}{2r^2} - (r_1-r_2)^2\right]}}{2}; \quad (4)$$

wherein $\theta_2$ represents a parametric variable of a function of the segment BC, with a range of $$\left[\arctan\frac{r_1\cos\alpha - F_2}{-r_1\sin\alpha - E_2}, \pi + \arctan\frac{F_2+r\sin\varphi}{E_2-r\cos\varphi}\right];$$

a coordinate formula for the segment CD is represented by:

$$\begin{cases} x_3 = r_3\cos\theta_3 - r\sin\varphi \\ y_3 = r_3\sin\theta_3 + r\cos\varphi \end{cases}; \quad (5)$$

wherein $r_3$ is the distance from the center $O_3$ to the tooth-side point of the tooth corresponding to the segment AB; r is a radius of a pitch circle between the segment AB and the segment FG, and $r=(r_1+r_6)/2$, in mm; y is an angle between the Y-axis and a segment $O_1O_3$;

$\varphi$ is obtained according to a flow channel period T through the following formula:

$$\varphi = \frac{T}{r} \cdot \frac{180°}{\pi}; \quad (6)$$

and $\theta_3$ represents a parametric variable of a function of the segment CD, with a range of $$\left[\delta - \frac{\pi}{2}, \arctan\frac{F_2+r\sin\varphi}{E_2-r\cos\varphi}\right];$$

a coordinate formula for the segment DE is represented by:

$$\begin{cases} x_4 = a+t \\ y_4 = b+kt \end{cases}; \quad (7)$$

wherein k is a slope of a line where the segment DE is located, and is represented by:

$$k = \frac{\frac{r_3^2-2r^2}{2r\sin\varphi} + b\cot\varphi + r\sin\varphi}{r\cos\varphi - b};$$

wherein a and b represent coordinates of point D, and are respectively represented by:

$$a = \frac{r_3^2-2r^2}{2r\sin\varphi} + \cot\varphi\cos\varphi\frac{2r^2-r_3^2}{2r} + \cot\varphi\sqrt{\cos^2\varphi\frac{(r_3^2-2r^2)^2}{(2r)^2} - \left[\frac{(r_3^2-2r^2)^2}{(2r)^2} - \frac{(2r)^2\sin^2\varphi}{4}\right]}; \quad (9)$$

and $$b = \cos\varphi\frac{2r^2-r_3^2}{2r} + \sqrt{\cos^2\varphi\frac{(r_3^2-2r^2)^2}{(2r)^2} - \left[\frac{(r_3^2-2r^2)^2}{(2r)^2} - \frac{(2r)^2\sin^2\varphi}{4}\right]}; \quad (10)$$

wherein t represents a parametric variable of a function of the segment DE, with a range of $$\left[0, \frac{r_3(\sin\delta - \cos\delta)}{k+1}\right];$$

a coordinate formula for the segment EF is represented by:

$$\begin{cases} x_5 = r_5\cos\theta_5 + E_5 \\ y_5 = r_5\sin\theta_5 + F_5 \end{cases}; \quad (11)$$

wherein $r_5$ is a radius of the segment EF;

an inclination angle of the line where the segment DE is located is expressed by:

$$\delta = \arctan k \quad (12);$$

$E_5$ and $F_5$ represent coordinates of the center $O_5$, and are respectively represented by:

$$E_5 = \frac{2k[r_5\cos\delta - kr_5\sin\delta - ak + b] + \sqrt{4k^2[r_5\cos\delta - kr_5\sin\delta - ak + b]^2 - 4(k^2+1)[(r_5\cos\delta - kr_5\sin\delta - ak + b)^2 - (r_6 + r_5)^2]}}{(2(k^2+1))}; \quad (13)$$

and $$F_5 = k(E_5 - r_5\sin\delta) + r_5\cos\delta - ak + b; \quad (14)$$

$\theta_5$ represents a parametric variable of a function of the segment EF, with a range of $$\left[\arctan\frac{-E_5}{F_5} - \frac{\pi}{2}, \arctan\frac{(k+1)(b-F_5) + r_3(\sin\delta - \cos\delta)}{(k+1)(a-E_5) + r_3(\sin\delta - \cos\delta)}\right];$$

a coordinate formula for the segment FG is represented by:

$$\begin{cases} x_6 = r_6\cos\theta_6 \\ y_6 = r_6\sin\theta_6 \end{cases}; \quad (15)$$

wherein $r_6$ is a radius of the segment FG; and $\theta_6$ represents a parametric variable of a function of the segment FG, with a range of $$\left[\frac{\pi}{2} + \arctan\frac{-E_5}{F_5}, \frac{\pi + \varphi}{2}\right];$$

wherein a roller tooth profile curve period T is 1.6-6 mm, wherein the roller tooth profile curve period is equal to the flow channel period T; $r_1$ is 20-200 mm; the flow channel depth h is 0.4-3 mm; $r_2$ is 0.15-0.35 mm; $r_5$ is 2.3-4.5 mm; $r_5$ is 0.15-0.35 mm; and an angle $\alpha$ between $O_1A$ and $O_1B$ is 0.11-4.3°.

4. A method for machining a work roll for roll forming of a flow channel of a metal bipolar plate, comprising:
obtaining a roller tooth profile of the work roll through the parametric design method of claim 3; and
machining the work roll based on the roller tooth profile.

* * * * *